United States Patent [19]

Frese et al.

[11] Patent Number: 5,717,333

[45] Date of Patent: Feb. 10, 1998

[54] MAGNET ARRANGEMENT FOR A DIAGNOSTIC MAGNETIC RESONANCE APPARATUS

[75] Inventors: Georg Frese, Herzogenaurach; Horst Siebold, Effeltrich, both of Germany

[73] Assignee: Siemens Aktiengesellschaft, Munich, Germany

[21] Appl. No.: 719,412

[22] Filed: Sep. 24, 1996

[30] Foreign Application Priority Data

Sep. 28, 1995 [DE] Germany .................. 195 36 261.6

[51] Int. Cl.$^6$ .................................................. G01V 3/00
[52] U.S. Cl. ........................................... 324/319; 324/320
[58] Field of Search .................................. 324/319, 318, 324/320, 322, 300; 335/296, 297; 128/653.5

[56] References Cited

U.S. PATENT DOCUMENTS

| | | | |
|---|---|---|---|
| 4,398,150 | 8/1983 | Barjhoux et al. | 324/319 |
| 4,689,591 | 8/1987 | McDougall | 335/299 |
| 4,721,914 | 1/1988 | Fukushima et al. | 324/320 |
| 4,875,485 | 10/1989 | Matsutani | 324/318 |
| 5,084,677 | 1/1992 | McDougall | 324/320 |
| 5,331,282 | 7/1994 | McDougall et al. | 324/319 |
| 5,365,927 | 11/1994 | Roemer et al. | 324/309 |
| 5,396,207 | 3/1995 | Dorri et al. | 335/216 |
| 5,428,292 | 6/1995 | Dorri et al. | 324/319 |
| 5,448,214 | 9/1995 | Laskaris | 335/301 |
| 5,463,364 | 10/1995 | Müller | 335/299 |

FOREIGN PATENT DOCUMENTS

| | | |
|---|---|---|
| 0 609 604 | 8/1994 | European Pat. Off. . |
| OS 36 39 140 | 5/1987 | Germany . |
| 36 16 078 | 1/1990 | Germany . |
| 2156079 | 10/1985 | United Kingdom ......... 324/319 |
| 2 275 538 | 8/1994 | United Kingdom . |

*Primary Examiner*—Louis M. Arana
*Attorney, Agent, or Firm*—Hill, Steadman & Simpson

[57] ABSTRACT

In a magnet arrangement for a diagnostic magnetic resonance apparatus, first and second units operate in combination to generate a magnetic field, the second unit being arranged at a distance from the first, the units determining a region having a substantially homogeneous magnetic field, which is arranged between the two magnetic field-generating units. An access to the region is oriented obliquely to the spacing of the two magnetic field-generating units. The magnetic field-generating units respectively have first and second outer transversal dimensions with the second outer transversal dimension being smaller than the first outer transversal dimension. The first magnetic field-generating unit has an opening that is fashioned as an additional access to the region.

12 Claims, 8 Drawing Sheets

MAGNET ARRANGEMENT FOR A DIAGNOSTIC MAGNETIC RESONANCE APPARATUS

BACKGROUND OF THE INVENTION

1. Field of the Invention

The present invention is directed to a magnet arrangement for a diagnostic magnetic resonance apparatus.

2. Description of the Prior Art

U.S. Pat. No. 5,084,677 discloses a magnet arrangement for a diagnostic magnetic resonance apparatus having a first unit that generates a magnetic field and a second such unit arranged at a distance from the first, these units respectively having first and second outer transversal dimensions, and the magnetic field-generating units determine a region with a substantially homogeneous magnetic field. This region is essentially arranged between the two magnetic field-generating units, and having an access to the region is oriented obliquely to the spacing of the two magnetic field-generating units. The second outer dimensions are fashioned so as to be smaller than the first outer dimensions.

In this known arrangement, the first magnetic field-generating unit consists of several superconducting coils arranged concentrically in one another. The coils are so dimensioned that they generate a homogeneous interior and exterior magnetic field upon being excited. For further homogenization of this magnetic field, and for minimization of the size of the first magnetic field-generating unit, the second magnetic field-generating unit is arranged with an axial spacing relative to the first. The clearance formed by the spacing between the two magnetic field-generating units is fashioned as an access to the homogeneous field region.

Another magnet arrangement is known from U.S. Pat. No. 5,365,927. In the open magnet arrangement specified therein, two axially spaced superconducting coils are provided as magnetic field-generating units, between which a region having a substantially homogeneous magnetic field is present. The homogeneous magnetic field region defines the imaging volume (FOV=field of view) of the diagnostic magnetic resonance apparatus. An imaging volume that is as large as possible is desired. Patient access ensues via a central opening in the magnetic coils along the magnetic axis of the magnetic coils. For medical interventions to the patient in the magnetic resonance apparatus, or for MRI-assisted operations, an access is provided obliquely to the axis of the magnetic coils, i.e. in the transverse direction.

From European Application 0 609 604, a magnet arrangement is known having a single magnetic field-generating unit. The magnet arrangement has two pole shoes arranged so as to lie opposite one another, connected with one another via a flux feedback path. A superconducting coil is arranged on one of the pole shoes as a magnetic field-generating unit. A smaller passive pole shoe without a magnetic drive is arranged opposite this pole shoe. The outer diameter of the active pole shoe, i.e. of the pole shoe on which the superconducting coil is arranged, is large in relation to the pole spacing. Thus, in this magnet arrangement there is only limited accessibility to the imaging volume.

SUMMARY OF THE INVENTION

An object of the present invention is to provide a magnet arrangement for a diagnostic magnetic resonance apparatus with a large homogeneous magnetic field region and improved accessibility.

This object is achieved in a diagnostic magnetic resonance apparatus of the type initially described wherein the first magnetic field-generating unit has an opening fashioned as an additional access to the region. In addition to the essentially improved lateral access region, a further access to the imaging region is provided. Nonetheless, the imaging volume or the region with homogeneous field distribution is sufficiently large for diagnostic applications.

If the magnetic field-generating units are fashioned so as to be rotationally symmetrical, the second diameter can be made smaller than half the first diameter, depending on the intended use of the magnetic resonance apparatus. The possible range of the second diameter in relation to the first diameter is from 1:2 to 1:8.

The spacing of the two magnetic field-generating units to one another lies in a region from half the first diameter to the entire first diameter.

In a further embodiment, the magnetic field-generating unit includes a permanent magnet, in particular also at the smaller pole.

In a further advantageous construction, the shape of the homogeneous magnetic field region can be adapted to requirements by means of a structuring of the side of the pole shoe facing the region.

In a further embodiment, an enlargement of the homogeneous region, with a simultaneous reduction of the stray field, results by surrounding the magnetic field-generating units with a ferromagnetic material on sides facing away from the region.

In another embodiment, an additional enlargement of the homogeneous magnetic field region, with a simultaneous reduction of the stray field, results by connecting the two magnetic field-generating units with one another with a flux feedback path made of a ferromagnetic material.

DESCRIPTION OF THE PREFERRED EMBODIMENTS

Figure 1:
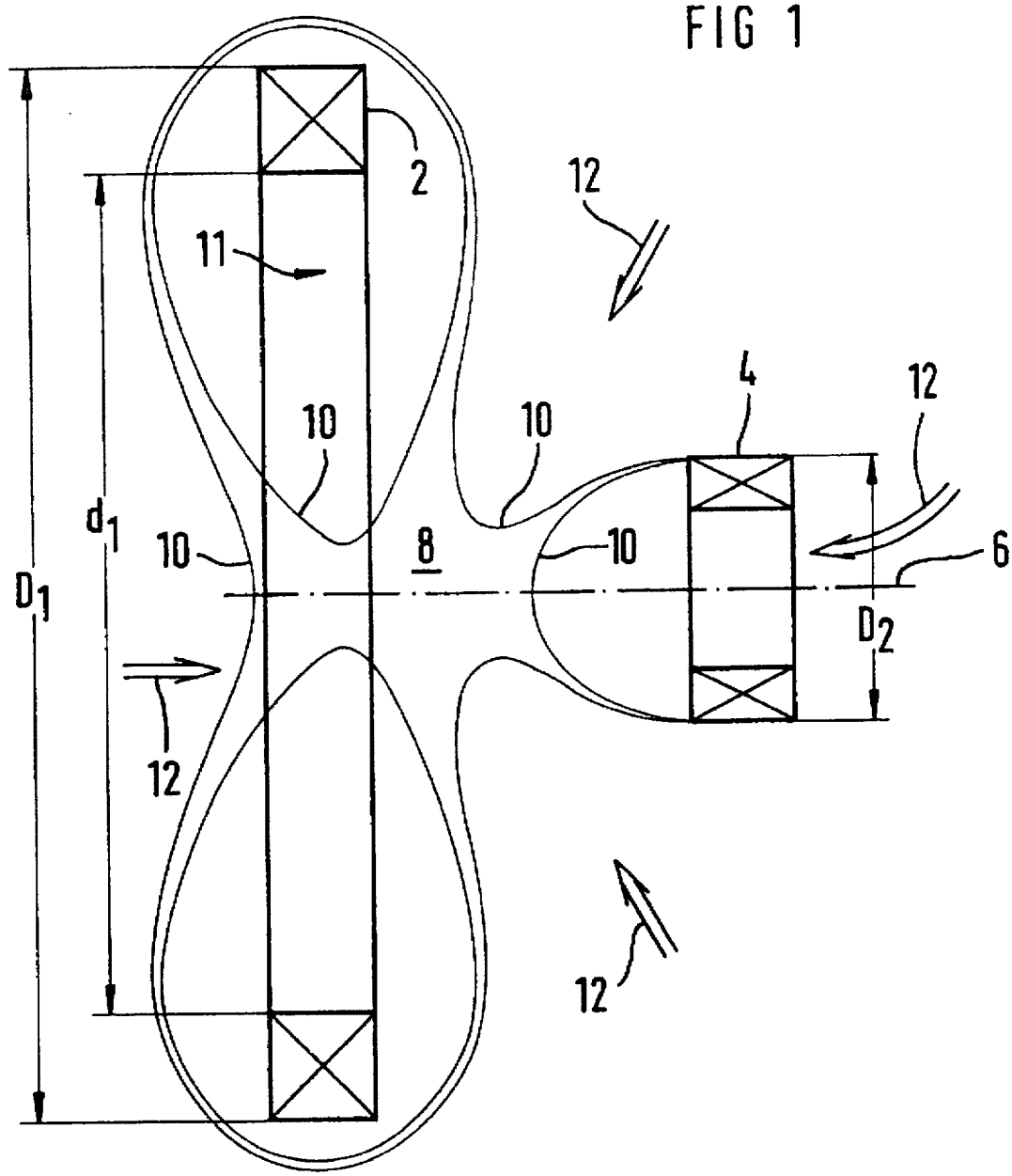
FIG. 1 shows an open magnet arrangement with a good access to the homogeneous field region.

FIG. 1 shows, in a sectional representation, a side view of a magnet arrangement for a diagnostic magnetic resonance apparatus having a first magnetic field-generating unit 2, fashioned as a magnetic coil, and a second magnetic field-generating unit 4, also fashioned as a magnetic coil and positioned axially at a distance from the first magnetic field-generating unit. Supporting structures for the magnetic field-generating units 2 and 4 are not shown; they may be realized using known constructive means. Likewise, the gradient coils, RF antennas, RF shieldings, patient bed, control computer, etc. associated with the magnetic resonance apparatus are not shown. The two magnetic field-generating units 2 and 4 are fashioned so as to be rotationally symmetrical to a symmetry axis 6, and respectively have first and second outer diameters $D_1$ and $D_2$. For example, the first outer diameter $D_1=1$ m and the second outer diameter $D_2=0.3$ m. A region 8 lies between the two magnetic field-generating units 2 and 4, here still in the interior of the magnetic field-generating unit 2; a substantially homogeneous magnetic field can be produced in this region if the two electromagnet coils 2 and 4 are excited by a corresponding direct current. For illustrating the extension of the homogeneous region 8, isocontour lines 10 of the magnitude of the magnetic field are shown, which bound the homogeneous field region 8.

The magnetic coil 2 surrounds an opening 11, whose inner diameter $D_1$ is chosen so large that a comfortable access to the homogeneous field region 8 is possible for a patient whose longitudinal axis is parallel to the axis of symmetry 6, even if the coil is a component of a magnetic resonance apparatus. The inner diameter is, for example, on the order of magnitude of 60 cm to 100 cm. The homogeneous region 8 does increase with the size of the first magnetic field-generating unit, but so does the power necessary for the excitation of the electromagnetic coils. The shape and size of the homogeneous field region 8 can also be influenced via the size of the second magnetic field-generating unit 4. In addition, the position and shape of the homogeneous field region 8 can be optimized via the relation of the outer diameters $D_1$ and $D_2$ of the two magnetic coils 2 and 4. The relation $D_1/D_2$ can lie in a range from 2 to 8, preferably from 3 to 6.

Arrows 12 illustrate the possible accesses to the homogeneous field region 8 of this open magnet arrangement. The possible accesses 12 are limited if necessary by means of the required supporting structure (not shown) for the magnetic field-generating units 2 and 4, however, there is an extensive freedom in the constructive design. The possible accesses 12 can be fashioned both as patient access to the homogeneous field region 8 and as a possible access for a physician for the purpose of interventional, MRI-aided techniques.

Figure 2:
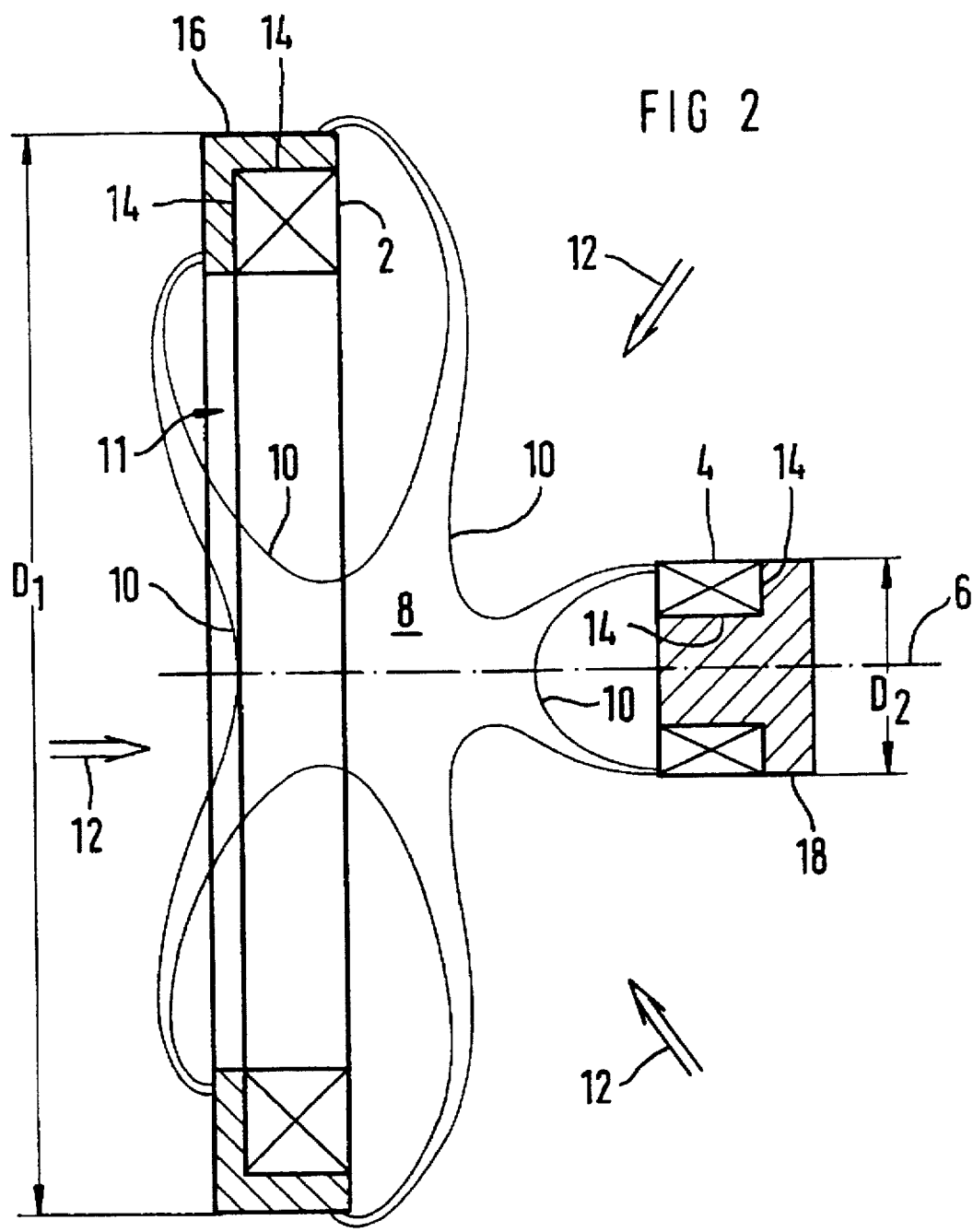
FIG. 2 shows a magnet arrangement with an enlarged homogeneous field region in relation to the arrangement according to FIG. 1.

FIG. 2 shows a magnet arrangement that has an enlarged region 8 in relation to the magnet arrangement according to FIG. 1. In addition, the stray field outside the magnet arrangement is reduced. This is achieved by the magnetic coils 2 and 4, at the sides 14 facing away from the region 8, being surrounded by a ferromagnetic material, e.g. iron. The first magnetic coil 2 is covered at the sides 14 by a ring 16 having an L-shaped cross-section. In the second magnetic coil 4, the ferromagnetic body 18 has a T-shaped cross-section, whereby a flange-shaped part of the body 18 covers the side 14 turned away from the homogeneous field region 8. The ferromagnetic body 18 additionally permits the ratio of the two outer diameters $D_1/D_2$ to be made larger in comparison with the embodiment according to FIG. 1, without deterioration of the homogeneous magnetic field region 8.

Figure 3:
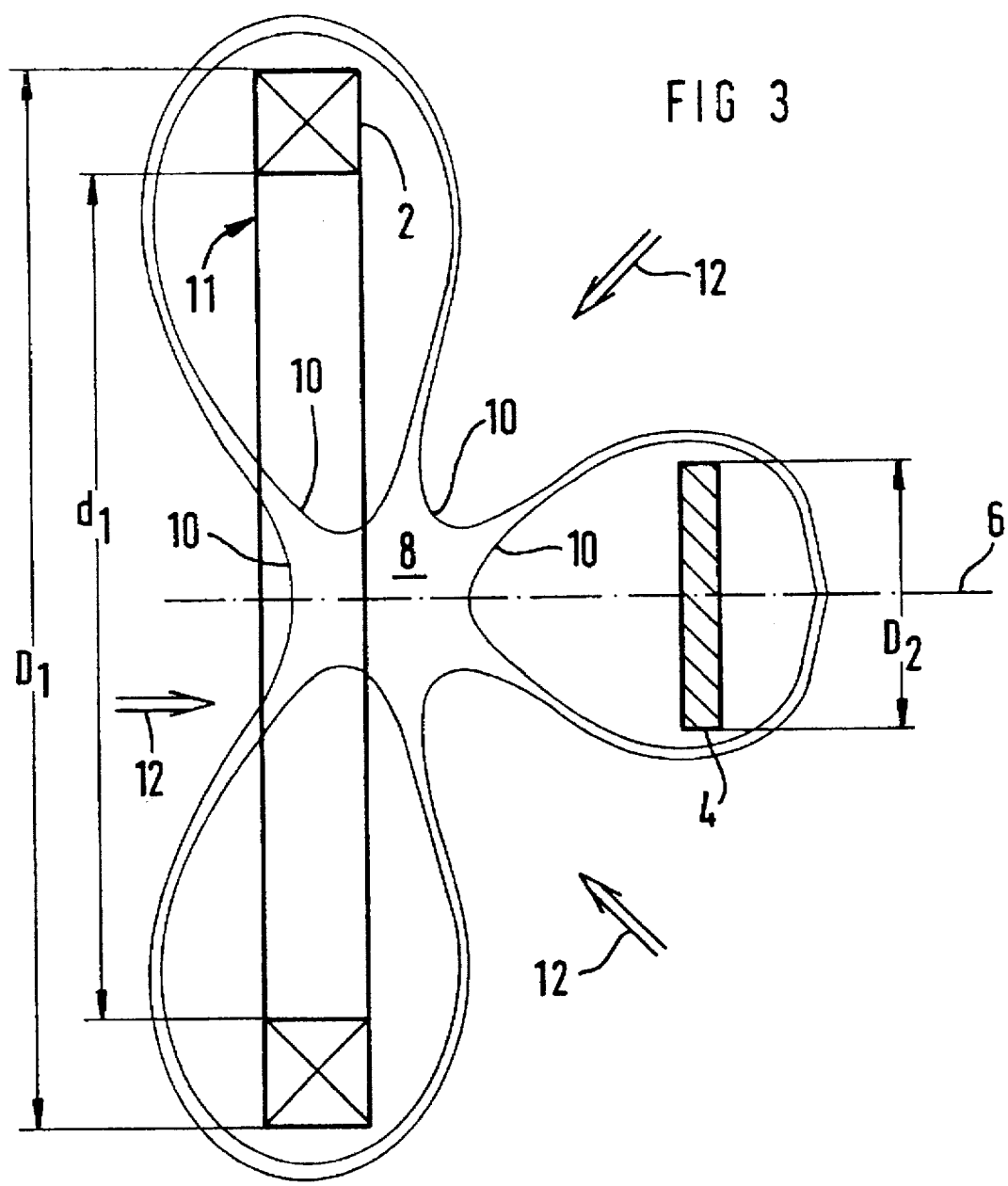
FIG. 3 a magnet arrangement with a permanent magnet.

FIG. 3 shows a further variant of the arrangement according to FIG. 1, in which the second magnetic field-generating unit 4 is a plate-shaped circular permanent magnet. Rare earth alloys are suited as material for the permanent magnet. The magnetization of the permanent magnet plate 4 is oriented parallel to the axis of symmetry 6.

Figure 4:
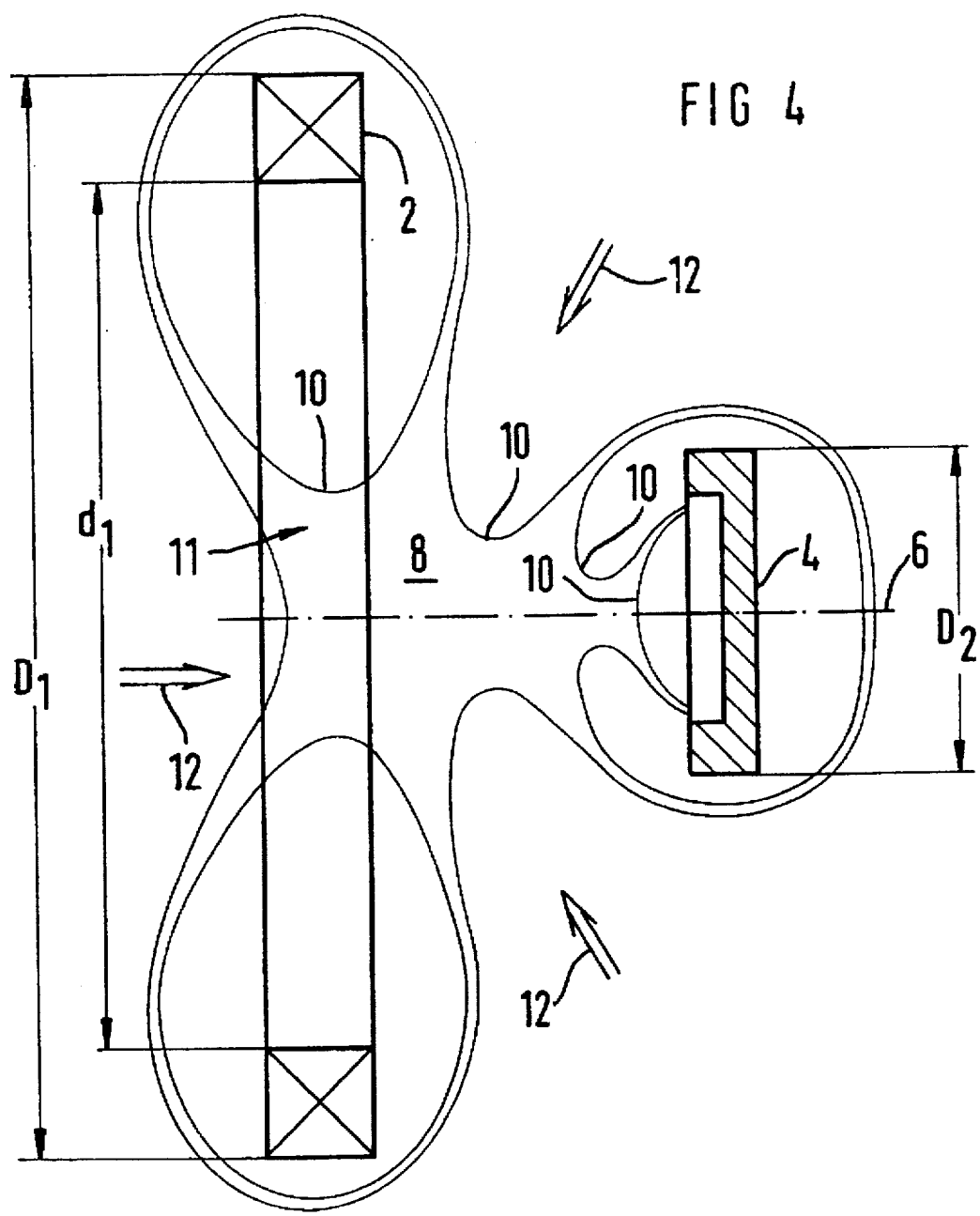
FIG. 4 shows a magnet arrangement with a permanent magnet whose surface is structured for the enlargement of the homogeneous region.

In the magnet arrangement shown in FIG. 4 as well, the second magnetic field-generating unit 4 is a permanent magnet. The side of the permanent magnet 4 facing the homogeneous magnetic field region 8 is profiled in order to enlarge the homogeneous field strength of the region 8 or in order to give the region 8 a desired shape. The cross-section of the rotationally symmetrical permanent magnet 4 is here fashioned in the shape of a U.

Figure 5:
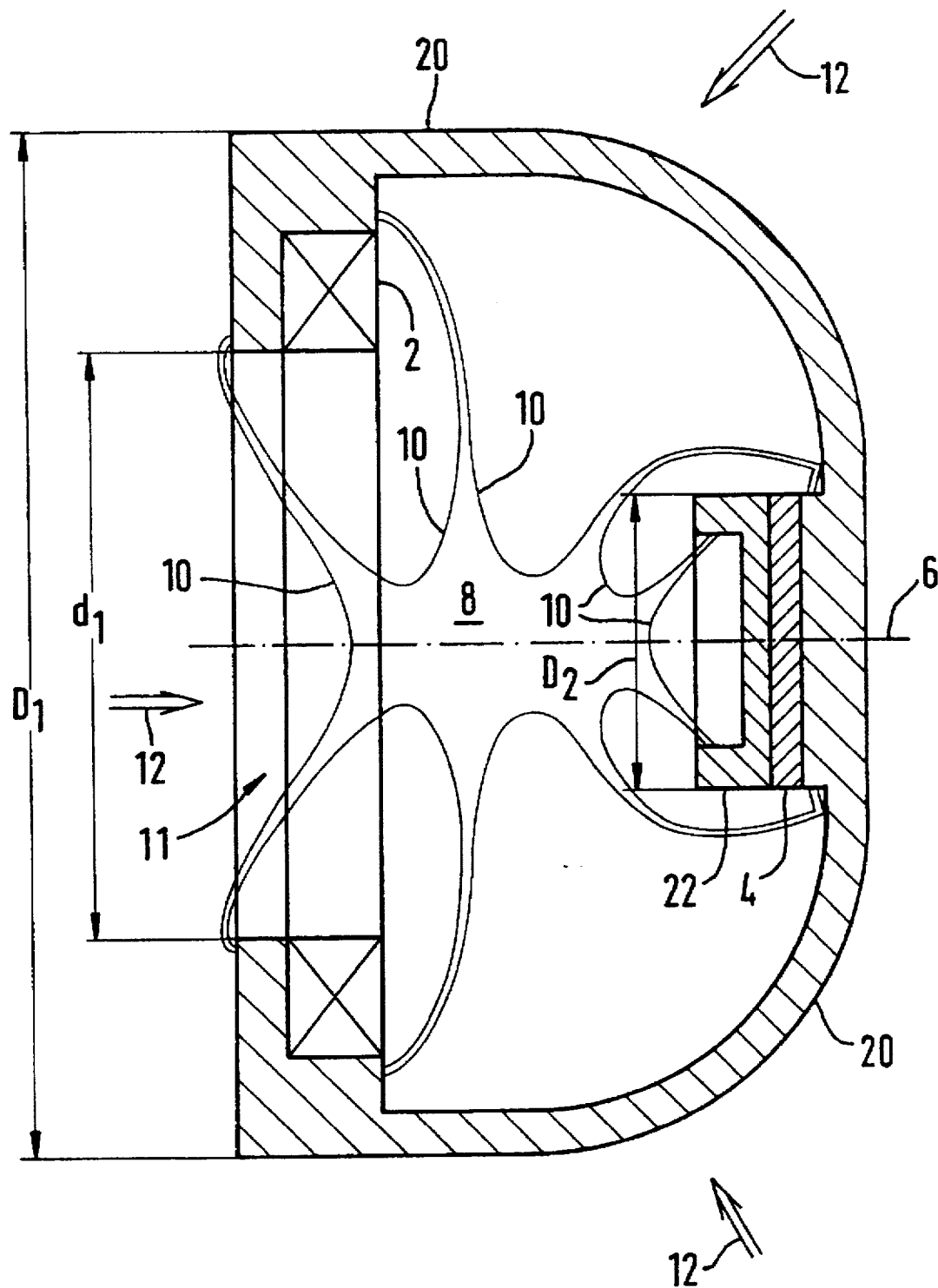
FIG. 5 shows a magnet arrangement with an electromagnet and a permanent magnet, connected with one another via a magnetic feedback path.

In the embodiment shown in FIG. 5, the two magnetic field-generating units 2 and 4 are connected with one another via a feedback path 20. The feedback path 20 reduces the stray field in comparison with a magnet arrangement without the feedback path, and reduces the power consumption or the use of permanent magnet material, and increases the homogeneous field region 8. Here the feedback path 20 is formed by two bow-shaped yoke parts, arranged so as to lie opposite one another, which connect the two magnetic field-generating units 2 and 4 with one another. The second magnetic field-generating unit is fashioned as a permanent magnet plate 4. A pole shoe 22 is arranged on the side of the plate 4 facing the region 8. The combination of permanent magnet plate 4 with the pole shoe 22 achieves the same effect as the profiled permanent magnet 4 of the embodiment shown in FIG. 4.

Figure 6:
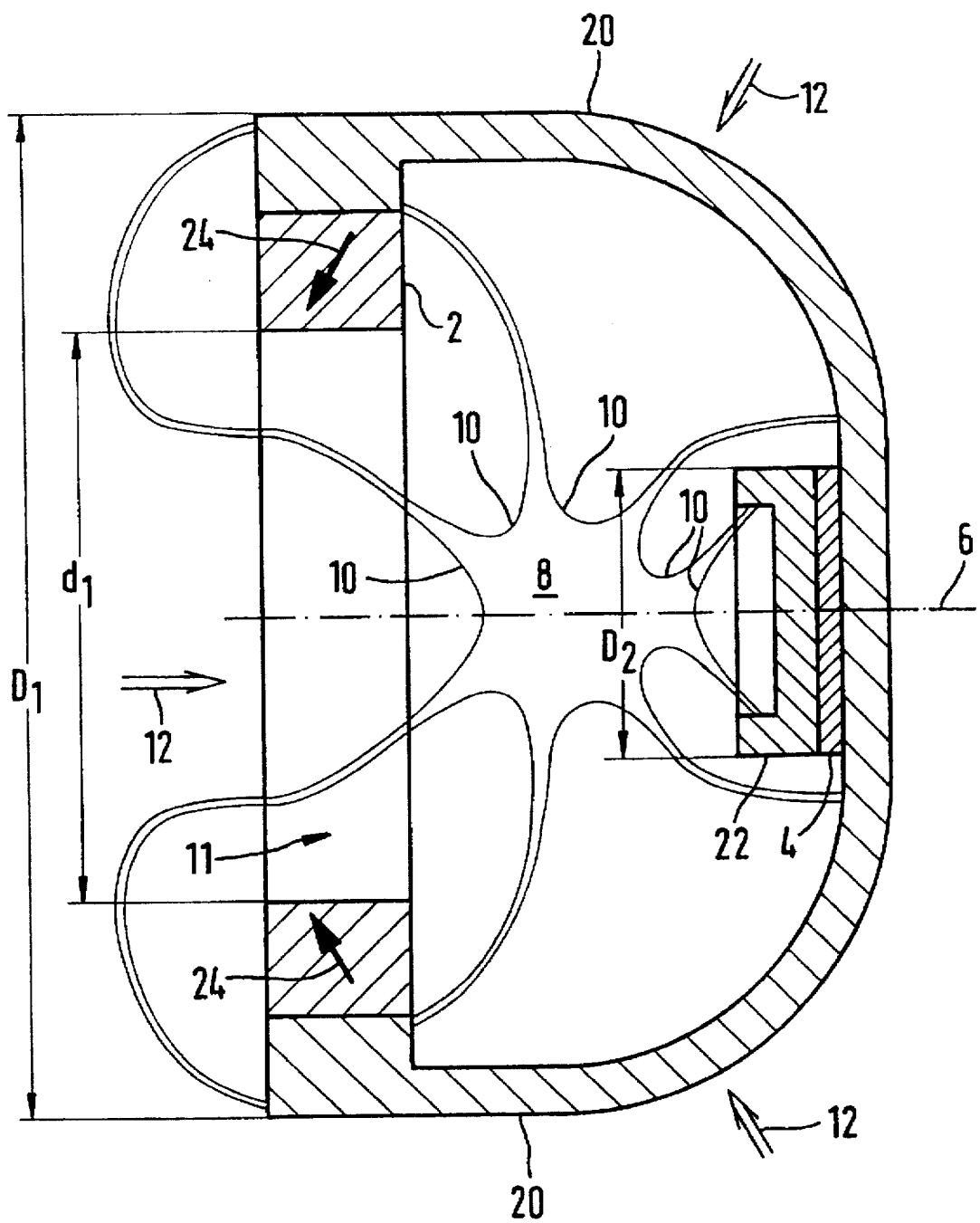
FIG. 6 shows a magnet arrangement with two permanent magnets connected with one another via a magnetic feedback path.

In the magnet arrangement according to FIG. 6, in contrast to the arrangement according to FIG. 5 the first magnetic field-generating unit 2 is realized by a permanent magnet ring. The magnetization, symbolized by arrows 24, has a radial component and a component parallel to the axis of symmetry 6. With the orientation chosen here of about 30° directed outwardly, an almost spherical region 8 having a homogeneous field distribution results.

Figure 7:
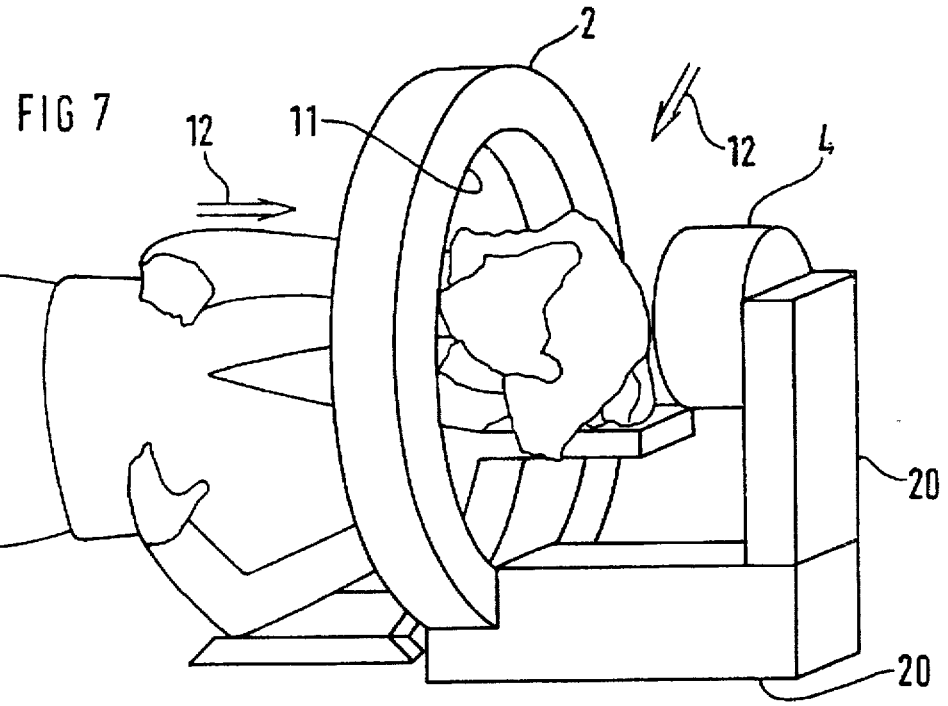
FIG. 7 shows a perspective view of an inventive magnet arrangement for the examination of sub-areas of the human body, here for application to the head region.
Figure 8:
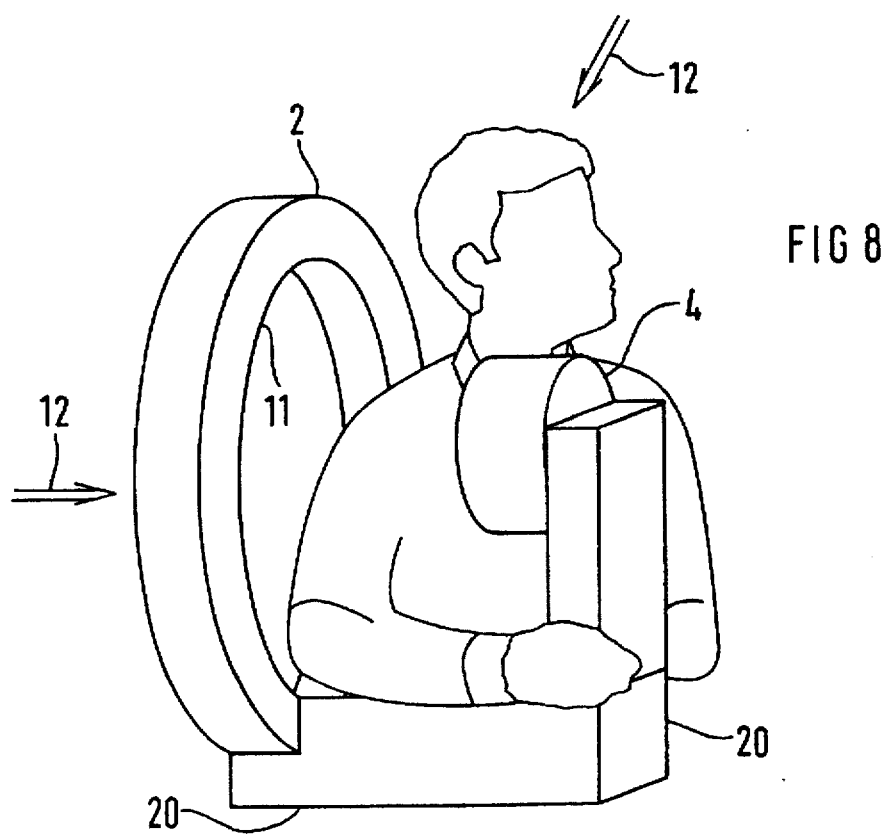
FIG. 8 shows the same arrangement as in FIG. 7, for an orthopedic application.

FIGS. 7 and 8 show a perspective view of the magnet arrangement for a magnetic resonance apparatus suited in particular for examinations of subregions of the human body. The spacing between the two magnetic field-generating units 2 and 4 here lies on the order of magnitude of the half outer diameter $D_1$ of the first magnetic field-generating unit, so that a substantially spherical homogeneous field region 8 results. The open magnet arrangement offers a good accessibility to the homogeneous field region 8, and thereby also offers many application possibilities. FIG. 7 shows the application for head examinations, whereby the possibility for interventions from the side is provided. Alternatively, FIG. 8 shows an application for orthopedics, in which interventions are possible in the axial direction of the arrangement.

Figure 9:
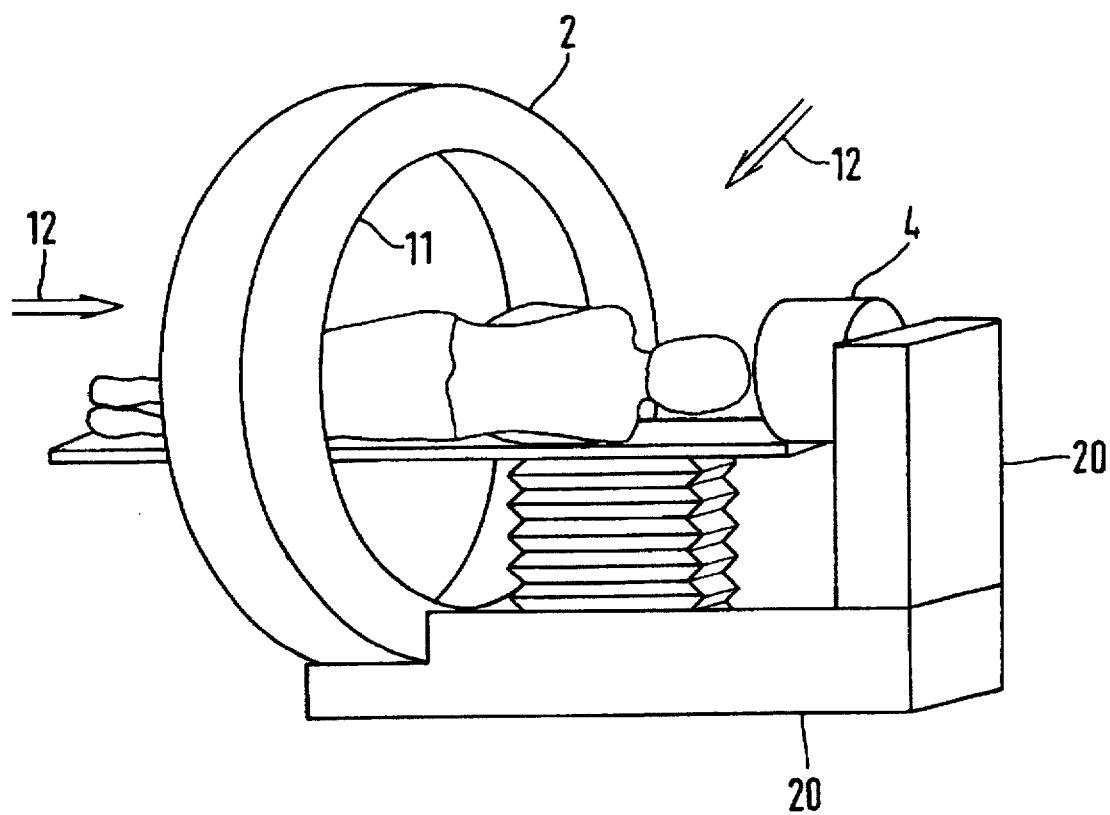
FIG. 9 shows a magnetic field arrangement adapted for whole-body examinations and for interventions, with an elliptical homogeneous magnetic field region.

The magnet arrangement shown in perspective view in FIG. 9 has an oblong region 8 through the enlarged spacing of the two magnetic field-generating units 2 and 4. The spacing lies in the region of the outer diameter $D_1$ of the first magnetic field-generating unit 2. This shape of the region 8 is particularly advantageous in whole-body examinations, whereby due to the increased spacing of the two magnetic field-generating units 2 and 4 an improved accessibility to the region 8 is additionally achieved.

The magnet arrangements shown in FIGS. 7, 8 and 9 all have in common a C-shaped magnetic feedback path 20.

The imaging volume can be extended to less homogeneous regions and thereby can be considerably enlarged, if the magnetic resonance apparatus operates with a correction algorithm that corrects image artefacts caused by inhomogeneous fields. For example, see the article of Krieg, Werthner, Ladebeck, "COSESS & INSESS—Coherent &

Incoherent Spin-Echo in the Steady State," in Proceedings of the Society of Magnetic Resonance and the European Society for Magnetic Resonance in Medicine and Biology, Nice, France, Aug. 19–25, 1995, vol. 1, p. 695, or the article by Luk Pat, Kerr, Nishimura, "Inhomogeneity Correction for Echo-Planar Imaging with a Polynomial Estimate of the Field Map," p. 617, or the article by Jezzard, Balaban, "Correction for Geometric Distortion in Echo Planar Images from $B_0$ Inhomogeneities," p. 104.

Although modifications and changes may be suggested by those skilled in the art, it is the intention of the inventors to embody within the patent warranted hereon all changes and modifications as reasonably and properly come within the scope of their contribution to the art.

I claim as my invention:

1. A diagnostic magnetic resonance apparatus comprising:
a first magnet unit which generates a first magnetic field;
a second magnet unit which generates a second magnetic field superimposed on said first magnetic field;
said second magnet unit being disposed a distance from said first magnet unit along an axis, said first magnet unit having a first outer transverse dimension and said second magnetic unit having a second outer transverse dimension, said second outer transverse dimension being less than said first outer transverse direction, and said superimposed first and second magnetic fields generating a substantially homogenous magnetic field in a region between said first and second magnet units;
said region between said first and second units being structurally unimpeded and permitting access to said region obliquely relative to said axis; and
said first magnetic unit having an opening therein permitting additional access to said region substantially along said axis.

2. A diagnostic magnetic resonance apparatus as claimed in claim 1, wherein each of said first and second magnet units is rotationally symmetrical, and wherein said first magnet unit has a first diameter defining said first outer transverse dimension and wherein said second magnet unit has a second diameter defining said second outer transverse dimension.

3. A diagnostic magnetic resonance apparatus as claimed in claim 2, wherein said second diameter is less than half of said first diameter.

4. A diagnostic magnetic resonance apparatus as claimed in claim 2, wherein said second diameter and said first diameter have a ratio in a range from 1:2 to 1:8.

5. A diagnostic magnetic resonance apparatus as claimed in claim 2, wherein a spacing between said first and second magnet units is in a range between one half of, and a whole of, said first diameter.

6. A diagnostic magnetic resonance apparatus as claimed in claim 1, wherein said first magnet unit is formed as a ring.

7. A diagnostic magnetic resonance apparatus as claimed in claim 1, wherein at least one of said first and second magnet units comprises a permanent magnet.

8. A diagnostic magnetic resonance apparatus as claimed in claim 1, wherein said first magnet unit comprises a ring-shaped permanent magnet having a magnetization with a radially oriented component.

9. A diagnostic magnetic resonance apparatus as claimed in claim 1, wherein at least one of said first and second magnet units comprises a resistive electromagnet.

10. A diagnostic magnetic resonance apparatus as claimed in claim 1, wherein said second magnet unit has a profiled surface on a side of said second magnet unit facing said region.

11. A diagnostic magnetic resonance apparatus as claimed in claim 1, wherein each of said first and second magnet units has a side facing away from said region, and further comprising ferromagnetic material surrounding the respective sides of said first and second magnet units facing away from said region.

12. A diagnostic magnetic resonance apparatus as claimed in claim 1, further comprising a feedback path composed of ferromagnetic material connecting said first and second magnet units to each other.

* * * * *